(12) United States Patent
Zhu et al.

(10) Patent No.: US 12,320,877 B2
(45) Date of Patent: Jun. 3, 2025

(54) MAGNETIC RESONANCE IMAGING SYSTEM

(71) Applicant: SINO CANADA HEALTH ENGINEERING RESEARCH INSTITUTE (HEFEI) LTD., Anhui (CN)

(72) Inventors: Haoqin Zhu, Anhui (CN); John Saunders, Anhui (CN); Gordon A. Klimenko, Anhui (CN); Darrell Van Mol, Anhui (CN)

(73) Assignee: SINO CANADA HEALTH ENGINEERING RESEARCH INSTITUTE (HEFEI) LTD. (CN)

( * ) Notice: Subject to any disclaimer, the term of this patent is extended or adjusted under 35 U.S.C. 154(b) by 169 days.

(21) Appl. No.: 18/327,734

(22) Filed: Jun. 1, 2023

(65) Prior Publication Data

US 2023/0333182 A1    Oct. 19, 2023

Related U.S. Application Data

(63) Continuation of application No. PCT/CN2020/133225, filed on Dec. 2, 2020.

(51) Int. Cl.
*G01R 33/422* (2006.01)
*G01R 33/30* (2006.01)

(52) U.S. Cl.
CPC ......... *G01R 33/422* (2013.01); *G01R 33/307* (2013.01)

(58) Field of Classification Search
CPC .............................. G01R 33/422; G01R 33/307
See application file for complete search history.

(56) References Cited

U.S. PATENT DOCUMENTS

| 2013/0082710 A1 | 4/2013 | Tropp |
| 2020/0249293 A1 | 8/2020 | Saunders et al. |
| 2022/0120834 A1* | 4/2022 | Li .......................... G01R 33/30 |

OTHER PUBLICATIONS

PCT CN Search Authority, International Search Report for PCT/CN2020/133225 dated Feb. 12, 2020.
PCT CN Search Authority, Written Opinion for PCT/CN2020/133225 dated Feb. 12, 2020.

* cited by examiner

*Primary Examiner* — G. M. A Hyder
(74) *Attorney, Agent, or Firm* — Haynes and Boone, LLP

(57) ABSTRACT

The present application relates to a magnetic resonance imaging system comprising: a magnetic resonance imaging device comprising a cylindrical gradient coil apparatus, a radio frequency coil apparatus configured to transmit radio frequency signals at a first frequency, and a first shielding apparatus comprising a first shielding layer arranged radially between the gradient coil apparatus and the radio frequency coil apparatus; and a patient table device comprising a table portion configured for a patient to lie on it, and a second shielding apparatus arranged around at least a portion of the table portion, wherein when the magnetic resonance imaging device is engaged with the patient table device, the first shielding apparatus is in electrical contact with the second shielding apparatus to form a cutoff waveguide which is capable of cutting off radio frequency signals at frequencies below a second frequency, the second frequency being greater than the first frequency.

10 Claims, 6 Drawing Sheets

MAGNETIC RESONANCE IMAGING SYSTEM

CROSS-REFERENCE TO RELATED APPLICATION

This application claims the benefit of priority of International Patent Application No. PCT/CN2020/133225, filed on Dec. 2, 2020, which is hereby incorporated by reference in its entirety.

TECHNOLOGY FIELD

The present application relates to the field of magnetic resonance imaging (MRI) and more particularly to a magnetic resonance imaging system.

BACKGROUND

An MRI system is used to form a digital image of at least a portion of internal structures and tissues of a patient (or subject) by scanning the patient utilizing radiology-based MRI technology. The MRI system generally comprises: a superconducting magnet apparatus operative to generate a strong and uniform static magnetic field (i.e., "primary magnetic field") that is useful for nuclear spins associated with hydrogen nuclei in the internal structures and tissues of the patient to be polarized; a gradient coil apparatus operative to generate a gradient magnetic field that is much less strong and varies with spatial position for identifying any spatial position of the internal structures and tissues of the patient; and a radio frequency (RF) coil apparatus for transmitting RF excitation pulses corresponding to the resonant frequency of the hydrogen nuclei (also known as the Larmor frequency) to add energy to the nuclear spins of the hydrogen nuclei and for receiving or detecting magnetic resonance (MR) signals which are created upon release of the added energy by the hydrogen nuclei and based on which the digital image is formed.

An RF shielding layer for electromagnetically isolating the gradient coil apparatus and the RF coil apparatus can be interposed therebetween in the MRI system so as to prevent electromagnetic coupling of the gradient coil apparatus and the RF coil apparatus. In the meanwhile, a specialized RF shielding room is required for placing the MRI system such that natural electromagnetic signals from an external environment or electromagnetic signals generated by other precision instruments nearby can be prevented from interfering with the MRI system, and the MRI system should be operated only when enclosed within such a specialized RF shielding room.

SUMMARY

An object of the present application is to provide an MRI system that is "localized RF shielding" by using RF shielding apparatuses in a simple, user-friendly and cost-saving manner.

According to an aspect of the present application, there is provided a magnetic resonance imaging system comprising: a magnetic resonance imaging device comprising a cylindrical gradient coil apparatus, a radio frequency coil apparatus arranged coaxially inside and in proximity to an inner diameter surface of the gradient coil apparatus and configured to transmit radio frequency signals at a first frequency, and a first shielding apparatus comprising a first shielding layer arranged radially between the gradient coil apparatus and the radio frequency coil apparatus; and a patient table device engageable with the magnetic resonance imaging device and comprising a table portion configured for a patient to lie on it, and a second shielding apparatus arranged around at least a portion of the table portion, wherein when the magnetic resonance imaging device is engaged with the patient table device, the first shielding apparatus is in electrical contact with the second shielding apparatus to form a cutoff waveguide around the table portion which is capable of cutting off radio frequency signals at frequencies below a second frequency, the second frequency being greater than the first frequency.

Optionally, the magnetic resonance imaging device is movable, and wherein the first shielding apparatus further comprises an anti-collision assembly electrically connected to the first shielding layer and configured to stop the movement of the magnetic resonance imaging device and simultaneously to come into in electrical contact with the second shielding apparatus when the magnetic resonance imaging device is moved to be engaged with the patient table device.

Optionally, the anti-collision assembly comprises a resilient anti-collision collar and an electrically conductive sleeve, the electrically conductive sleeve comprising a first sleeve portion and a second sleeve portion that cover both ends of the anti-collision collar respectively and are not in electrical contact with each other when the magnetic resonance imaging device is disengaged from the patient table device, and the anti-anti-collision collar is compressed to bring the first sleeve portion into electrical contact with the second sleeve portion when the magnetic resonance imaging device is engaged with the patient table device.

Optionally, the magnetic resonance imaging device defines a columnar magnet bore having a center and comprising a service port distal from the patient table device when the magnetic resonance imaging device is engaged with the patient table device, and wherein the first shielding apparatus further comprises a shielding door adapted to close the service port and to be openable, the shielding door being in electrical contact with the first shielding layer when closing the service port.

Optionally, the second shielding apparatus defines a delivery bore around the at least a portion of the table portion, the delivery bore comprising an open port configured for the patient's feet to pass through.

Optionally, the second shielding apparatus comprises a lower shielding component and an upper shielding component separable from the lower shielding component, the upper shielding component being in electrical contact with the lower shielding component when placed above the lower shielding component.

Optionally, the upper shielding component comprises an arch-shaped body comprising a first transparent layer, a second shielding layer and a second transparent layer which are laminated with each other, the first transparent layer and the second transparent layer being insulative and the second shielding layer being electrically conductive and being configured as a web made from an electrically conductive material such that that the arch-shaped body is transparent or translucent.

Optionally, the upper shielding component further comprises an upper electrically conductive section extending longitudinally from the arch-shaped body and expanding in diameter gradually so as to be able to be aligned with the first shielding apparatus and comprising an upper electrically conductive flange adapted to be in electrical contact with the first shielding apparatus.

Optionally, the lower shielding component comprises a transfer plate above which the table portion is movably fitted and which has an upper surface with an edge provided with a resilient electrically conductive spacer, the upper shielding component being in electrical contact with the lower shielding component via the electrically conductive spacer when the upper shielding component is placed above the lower shielding component.

Optionally, the transfer plate comprises a lower end section extending longitudinally and being contoured to be able to be aligned with the first shielding apparatus, the lower end section being provided with a lower electrically conductive flange adapted to be in electrical contact with the first shielding apparatus.

The MRI system provided by the present application comprises the first shielding apparatus (which is an RF shielding apparatus) arranged in the MRI device and the second shielding apparatus arranged around the table portion which constitute the cutoff waveguide to effectively cut off natural electromagnetic signals from an external environment or electromagnetic signals generated by other precision instruments nearby which may interfere with the radio frequency signals transmitted by the RF coil apparatus of the MRI system. Thus, the localized RF shielding is achieved by means of the first and second shielding apparatuses and there is no need to provide a dedicated RF shielding room for placing the MRI system. The cost for achieving the localized RF shielding is one tenth or less of the cost of providing the dedicated RF shielding room. Further, as the cutoff waveguide can function to cut off frequencies, the second shielding apparatus can be open, i.e., not completely enclosed, thereby enhancing the patient's experience of being diagnosed by the MRI system and providing design flexibility to the MRI system.

Other features of the present application and its advantages will become clear from the following detailed description of exemplary embodiments of the application with reference to the accompanying drawings.

BRIEF DESCRIPTION OF THE DRAWINGS

The accompanying drawings, which are incorporated in and constitute a part of the specification, illustrate embodiments of the present application and, together with the description thereof, serve to explain the principles of the present application.

DETAILED DESCRIPTION OF EMBODIMENTS

Figure 1:
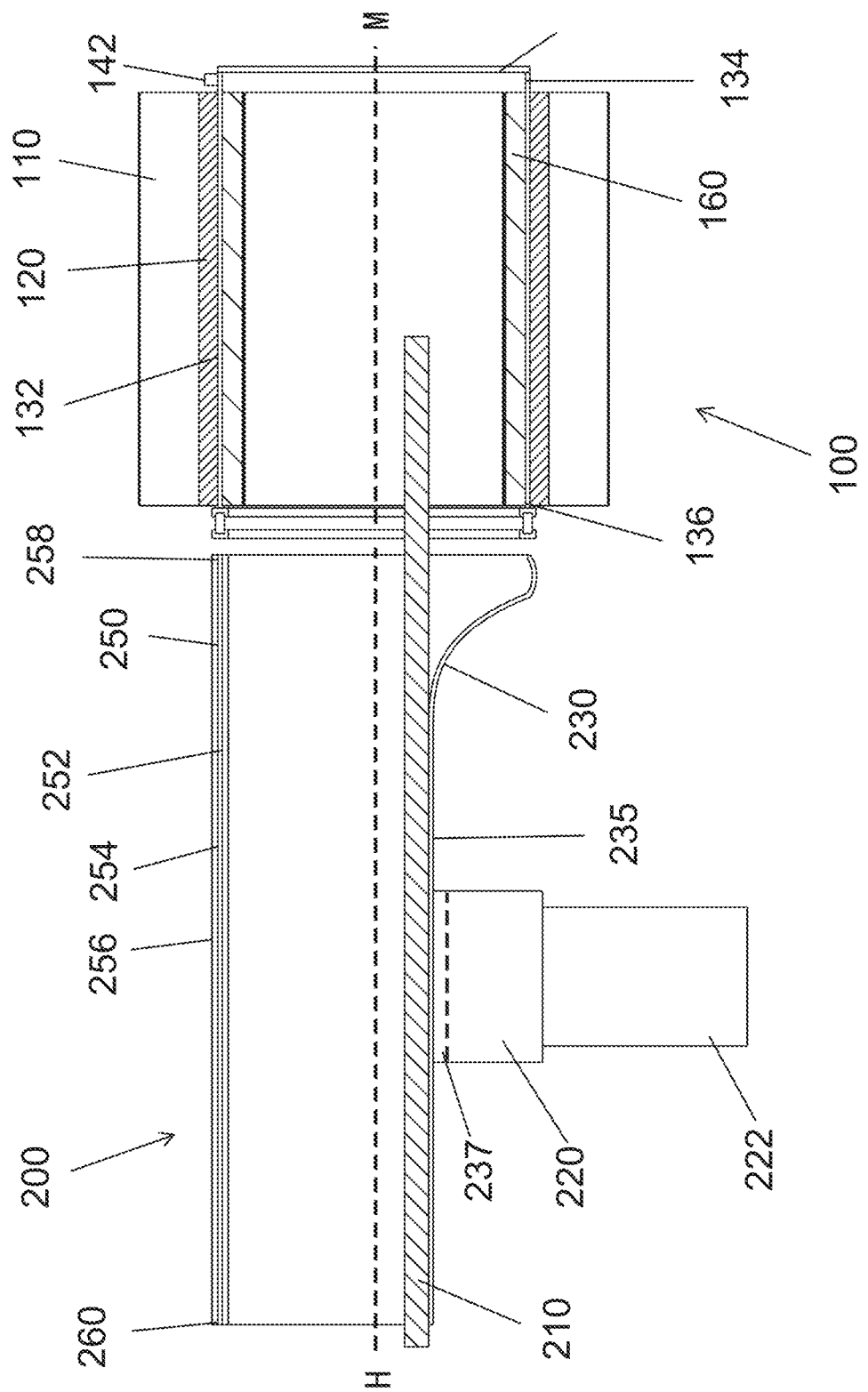
FIG. 1 is a schematic cross-sectional view of an MRI system according to an embodiment of the present application in which a patient table device is detached from an MRI device.

Various exemplary embodiments of the present application will now be described in detail with reference to the accompanying drawings. It should be noted that the relative arrangement of the components and steps, the numerical expressions, and numerical values set forth in these embodiments do not limit the scope of the present application unless it is specifically stated otherwise.

Techniques, methods and apparatus as known by one of ordinary skill in the relevant art may not be discussed in detail but are intended to be part of the specification where appropriate.

In all examples of the embodiments discussed herein, any specific values should be interpreted as merely illustrative and not as exclusive. Thus, the embodiments may have different values.

It should be noted that similar reference numerals and letters refer to similar items in the accompanying drawings, and thus once an item is defined in one figure, it is possible that it need not be further discussed for following figures.

It should also be noted that in the present specification "upper" and "above" refer to a direction distal from a ground on which an MRI system is placed, "lower" and "below" refer to a direction towards the ground, and "longitudinal" refers to a direction along which a patient lies in the MRI system. However, the use of "upper", "above", "lower", "below", "longitudinal" and variations of these terms is made for convenience and does not require any particular orientation of the MRI system's devices, apparatuses or components unless otherwise stated.

Figure 2:
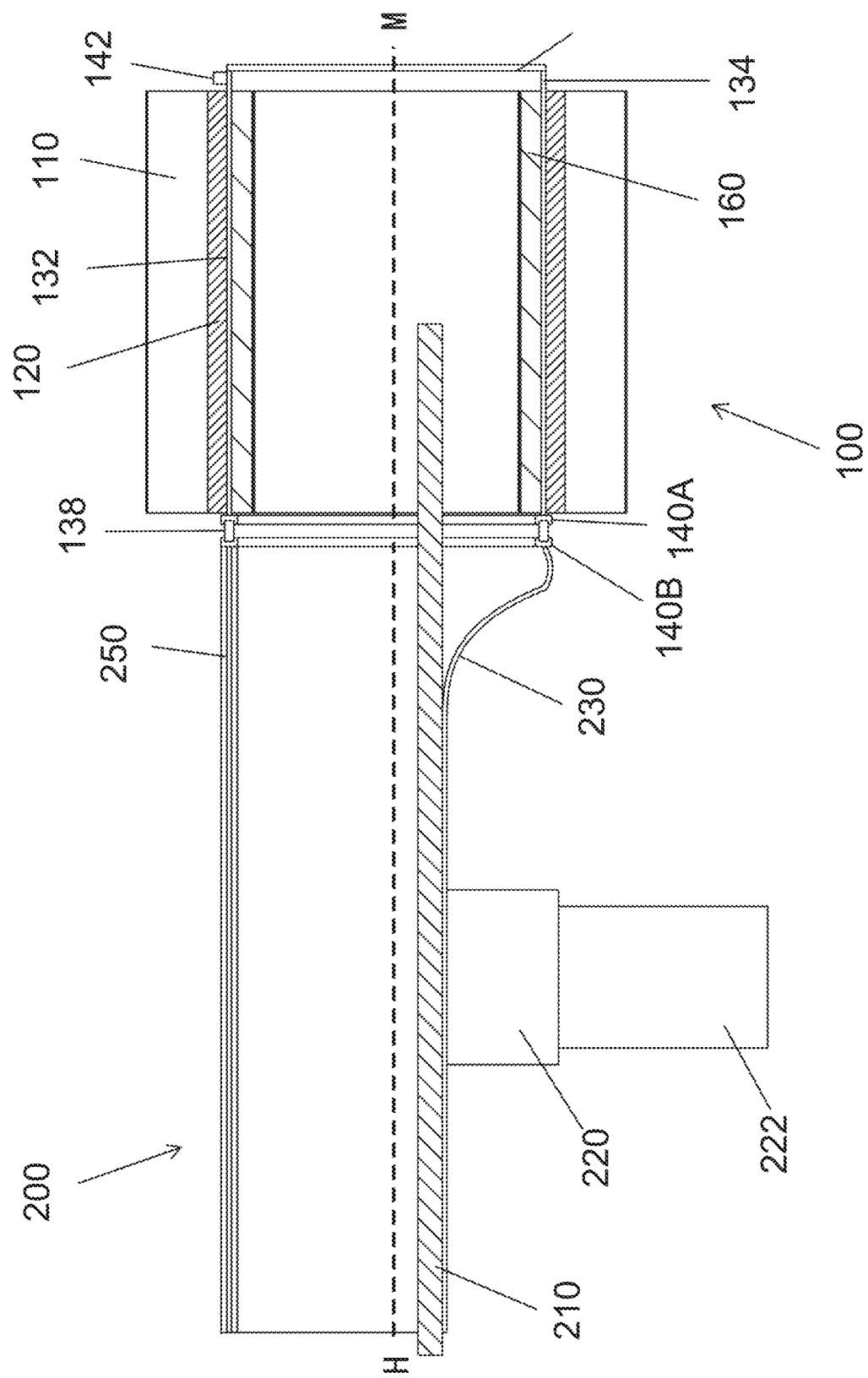
FIG. 2 is another schematic cross-sectional view of the MRI system of FIG. 1 in which the patient table device is aligned with and going to be engaged with the MRI device.
Figure 3:
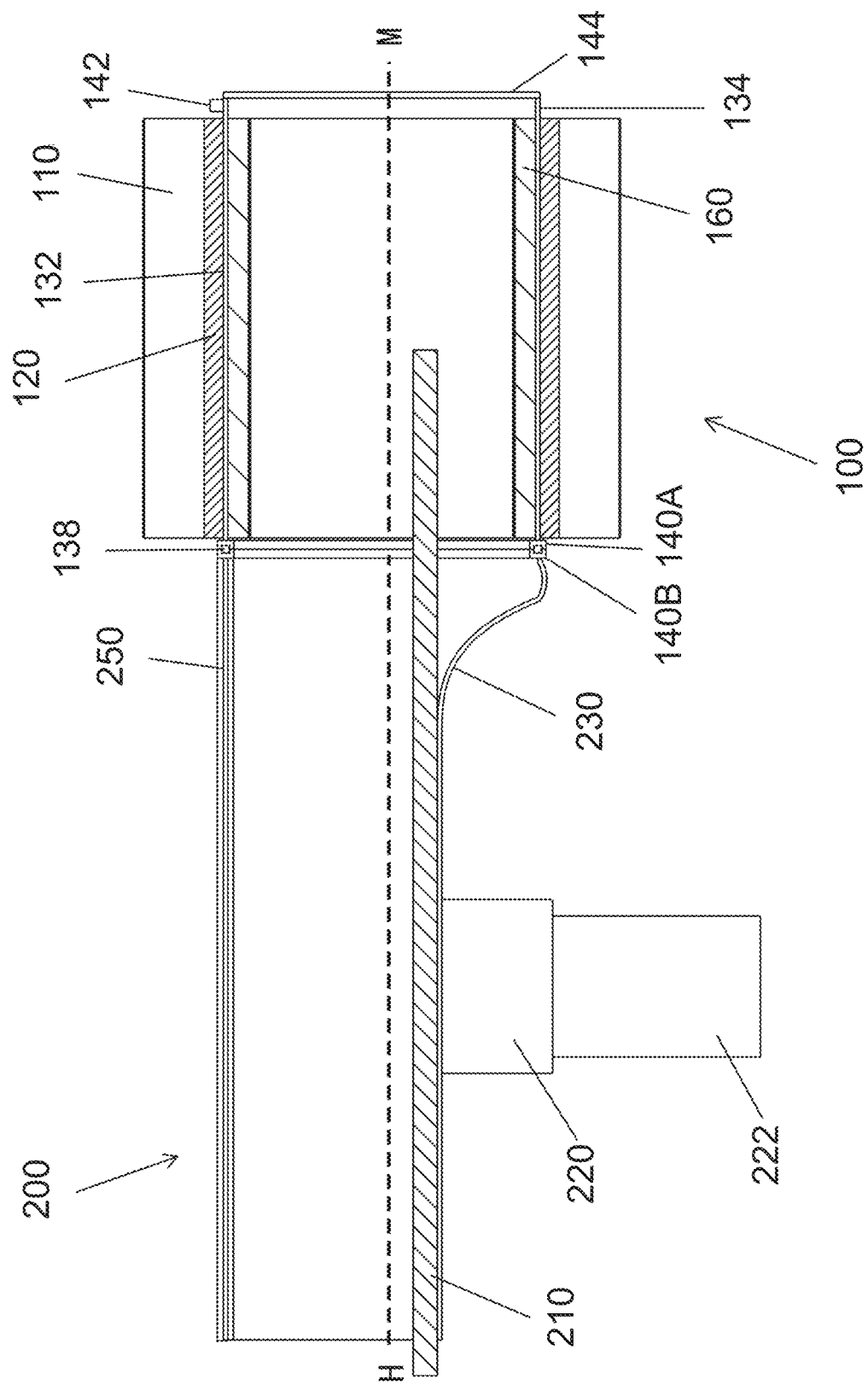
FIG. 3 is yet another schematic cross-sectional view of the MRI system of FIG. 1 in which the patient table device is engaged with the MRI device.

Referring to FIGS. 1 to 3, an exemplary MRI system generally comprises an MRI device 100 and a patient table device 200. The MRI device 100 can be moved automatically or manually by means a displacement mechanism (not shown, e.g., wheels, or track and pulley assembly, etc.), and thus the MRI device 100 can be disengaged from the patient table device 200 when the MRI system is not going to operate and the MRI device 100 can be engaged with the patient table device 200 before the MRI system is ready to scan the patient. E.g., the patient can lie on the patient table device 200 in advance when the patient table device 200 is disengaged from the MRI device 100, and then the movable MRI device 100 can be moved closer to the patient table device 200, aligned with the patient table device 200, and eventually engaged with the patient table device 200. How the MRI device 100 is engaged with the patient table device 200 will be described in more details below.

The exemplary MRI device 100 generally comprises a superconducting magnet apparatus 110, a gradient coil apparatus 120, a first shielding layer 132, and an RF coil apparatus 160 arranged coaxially and successively in a radially inward direction. The exemplary MRI device 100 further comprises one or more controllers (not shown) that control the superconducting magnet apparatus 110 and the gradient coil apparatus 120 to generate desired magnetic fields and control the RF coil apparatus 160 to generate desired RF excitation pulses (or RF signals). It will be appreciated that the one or more controllers are coupled with the superconducting magnet apparatus 110, the gradient coil apparatus 120, the RF coil apparatus 160, and their auxiliary electrical components (e.g., various amplifiers, sensors, etc.) in an electrical connection and/or communication connection way via one or more electrical cables and/or data transmission cables such that the entire MRI device 100 can be operated in a controlled manner.

The MRI device 100 comprising the superconducting magnet apparatus 110, the gradient coil apparatus 120, the first shielding layer 132, and the RF coil apparatus 160 defines a columnar magnet bore having a center and having a first central axis M in a longitudinal direction. Thus, the expression "arranged coaxially" means that the first central axis M is configured as a common central axis of the superconducting magnet apparatus 110, the gradient coil apparatus 120, the first shielding layer 132, and the RF coil apparatus 160. The magnet bore has a "service port" and a "patient port" that are positioned opposite to each other along the first central axis M, the service port being further away from the patient table device 200 than the patient port when the MRI device 100 is engaged with the patient table device 200.

The superconducting magnet apparatus 110 is arranged at an exterior of the MRI device 100 with respect to the gradient coil apparatus 120, the first shielding layer 132, and the RF coil apparatus 160 and is cylindrical. As is known, the superconducting magnet apparatus 110 can comprise a helium storage container by which a low temperature of the superconducting magnet apparatus is maintained and the superconducting magnet apparatus can be thermally isolated from other apparatuses. The gradient coil apparatus 120 is arranged coaxially inside and in proximity to an inner diameter surface of the superconducting magnet apparatus 110 and is cylindrical. Similarly, the RF coil apparatus 160 is arranged coaxially inside and in proximity to an inner diameter surface of the gradient coil apparatus 120 and is cylindrical. For preventing electromagnetic coupling between the gradient coil apparatus 120 and the RF coil apparatus 160, the first shielding layer 132 is arranged radially between the gradient coil apparatus 120 and the RF coil apparatus 160, that is, the first shielding layer 132 has an outer diameter surface in proximity to the inner diameter surface of the gradient coil apparatus 120 and an inner diameter surface in proximity to an outer diameter surface of the RF coil apparatus 160. It will be appreciated that in this specification the expression "in proximity to" means that there may be some radial gap between the individual apparatuses or the individual apparatuses may be abut against each other. It will also be appreciated that the description of other components of the MRI device 100 such as a housing, a support and/or a suspension component, and end caps is omitted herein for clarity.

The one or more controllers can activate the superconducting magnet apparatus 110 to generate a primary magnetic field $B_0$ distributed in the magnet bore substantially along or parallel to the first central axis M. Also, the one or more controllers can activate the gradient coil apparatus 120, that is, activate an X-axis gradient coil, a Y-axis gradient coil, and a Z-axis gradient coil of the gradient coil apparatus 120 to generate a gradient magnetic field for spatially encoding MR signals. Also, the one or more controllers can activate the RF coil apparatus 160, e.g., a body coil for transmitting RF excitation pulses, to generate an RF magnetic field $B_1^+$ for scanning desired internal structures and tissues of the patient, the RF magnetic field $B_1^+$ being perpendicular to the primary magnetic field $B_0$ in the magnet bore. Alternatively, the one or more controllers can activate the RF coil apparatus 160, e.g., a body coil for receiving the MR signals, to receive the MR signals which are from the patient and created thanks to the RF magnetic field $B_1$.

Optionally, the first shielding layer 132 is comprised by a first shielding apparatus, which further comprises an anti-collision assembly and a shielding door. The first shielding layer 132 is cylindrical so as to be circumferentially arranged between the gradient coil apparatus 120 and the RF coil apparatus 160 and comprises a first end 136 and a second end 134 which are positioned opposite to each other along the first central axis M and have a substantially annular cross-section. The first end 136 and the second end 134 protrude or are exposed from the gradient coil apparatus 120 and the RF coil apparatus 160 so as to be electrically connected to the anti-collision assembly and to be able to come into electrical contact with the shielding door 144 respectively. It will be appreciated that in this specification the expressions "electrically connected to" and "in electrical contact with" mean that the individual components, the individual apparatuses, and the individual devices of the MRI system are permanently electrically connected or temporarily electrically contacted for RF shielding purpose and are not required to be powered when the MRI system is operating.

The first shielding layer 132 is configured as a web or textile made from an electrically conductive material comprising, e.g., copper, stainless steel or any other electrically conductive compositions and possibly doped with other materials such as epoxy resin or glass fiber tape. On the one hand, the first shielding layer 132 is used to electromagnetically isolate the gradient coil apparatus 120 and the RF coil apparatus 160 thereby avoiding the electromagnetic coupling between the gradient coil apparatus 120 and the RF coil apparatus 160 from adversely affecting the quality factor of the RF coil apparatus 160. On the other hand, as the first shielding layer 132 is arranged radially inward from the gradient coil apparatus 120, there is no need to filter signals carried by electrical cables and/or data transmission cables which are from outside of the MRI device 100 and are connected into the gradient coil apparatus 120. It should be noted that in the present application the first shielding layer 132 that is cylindrical and hence the first shielding apparatus is used to constitute a first section of a cutoff waveguide, the first section of the cutoff waveguide contains the magnet bore, and the cutoff waveguide effectively cuts off natural electromagnetic signals from an external environment or electromagnetic signals generated by other precision instruments nearby which may interfere with the RF signals transmitted by the RF coil apparatus 160 of the MRI system.

Further, the anti-collision assembly electrically connected to the protruding or exposed first end 136 of the first shielding layer 132 prevents the movable MRI device possibly weighing up to 2 tons from moving excessively so as to prevent the patient from being accidentally injured by the MRI device.

E.g., the anti-collision assembly comprises a resilient and insulative anti-collision collar 138. Referring to FIG. 1, the anti-collision collar 138 has a first length $L_1$ in the longitudinal direction equal to its unloaded natural length when the MRI device 100 is disengaged from the patient table device 200. Referring to FIG. 2, the anti-collision collar 138 is loaded and compressed by longitudinal opposing compression forces applied by the MRI device 1000 and the patient table device 20 respectively when the MRI device 100 is aligned with and going to be engaged with the patient table device 200 such that the anti-collision collar 138 is deformed to have a second length $L_2$ equal to or less than the first length $L_1$ in the longitudinal direction. Referring to FIG. 3, the anti-collision collar 138 is further deformed to have a third length $L_3$ less than the second length $L_2$ in the longitudinal direction and hence less than the first length $L_1$ when the MRI device 100 is engaged with the patient table device 200, i.e., when the MRI system is ready for operation.

Referring to FIGS. 2 and 3, the anti-collision assembly further comprises a resilient electrically conductive sleeve comprising a first sleeve portion 140A and a second sleeve portion 140B, both of which cover both ends of the anti-collision collar 138 that are positioned opposite to each other along the first central axis M. The first sleeve portion 140A is annular and electrically connected to the first end 136 of the first shielding layer 132 in an overlying manner, and the first sleeve portion 140A has a radial thickness significantly greater than that of the first shielding layer 132 so as to help the first sleeve portion 140A to be electrically connected to the first end 136 of the first shielding layer 132. It will be appreciated that in this specification the expression "radial thickness" means a distance from an outer diameter surface to an inner diameter surface of the first sleeve portion. As the insulative anti-collision collar 138 has the first length $L_1$ or is deformed to have the second length $L_2$ when the MRI device 100 is aligned with but has not yet been engaged with the patient table device 200, the first sleeve portion 140A is not in electrical contact with the second sleeve portion 140B, which means the anti-collision assembly is not electrically conductive. As the anti-collision collar 138 has the third length $L_3$ when the MRI device 100 is engaged with the patient table device 200, the first sleeve portion 140A comes into electrical contact with the second sleeve portion 140B, which means the anti-collision assembly becomes electrically conductive. In the meanwhile, the anti-collision collar 138 has an embedded relay (not shown) that is electrically connected to the displacement mechanism of the MRI device 100, the relay being configured to stop the displacement mechanism of the MRI device 100 from moving when the anti-collision collar 138 has the third length $L_3$ (i.e., the MRI device 100 is moved to be engaged with the patient table device 200) thereby preventing the patient from being accidentally injured by the MRI device.

Optionally, the first shielding apparatus further comprises a filter 142 arranged on the protruding second end 134 of the first shielding layer 132 and electrically connected to the first shielding layer 132. The filter 142 extends through the first shielding layer 132 via which electrical cables and/or data transmission cables that are from outside of the first shielding layer and/or are led out to outside of the first shielding layer 132 can be connected into the RF coil apparatus 160 and can be filtered. Thus, the filter 142 allows the electrical cables and/or data transmission cables to pass through the first shielding layer 132 while not affecting electromagnetic shielding effect of the first shielding layer 132. Further, a grounding connector can be conveniently arranged on the filter 142 to ground the first shielding layer 132 so as to ensure performance of the RF coil apparatus 160.

Optionally, the first shielding apparatus further comprises a shielding door 144 that is adapted to close the service port of the magnet bore and to be openable, the shielding door 144 being configured to be in electrical contact with the second end 134 of the first shielding layer 132 when closing the service port. E.g., the shielding door 144 is an engineering plastic sheet with a copper plating on its surface to make the shielding door 144 light weight and low cost.

Figure 4:
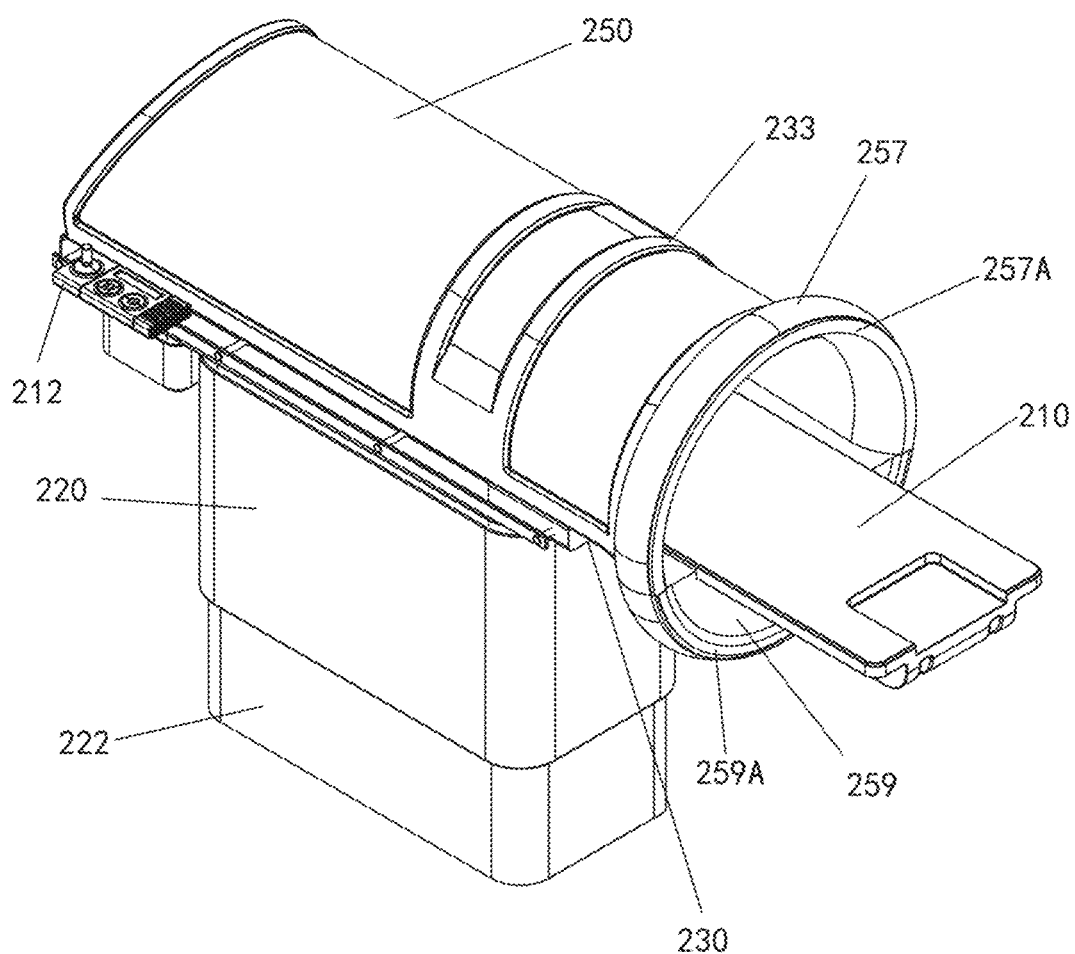
FIG. 4 is a perspective view of a patient table device of an MRI system according to an embodiment of the present application.
Figure 5:
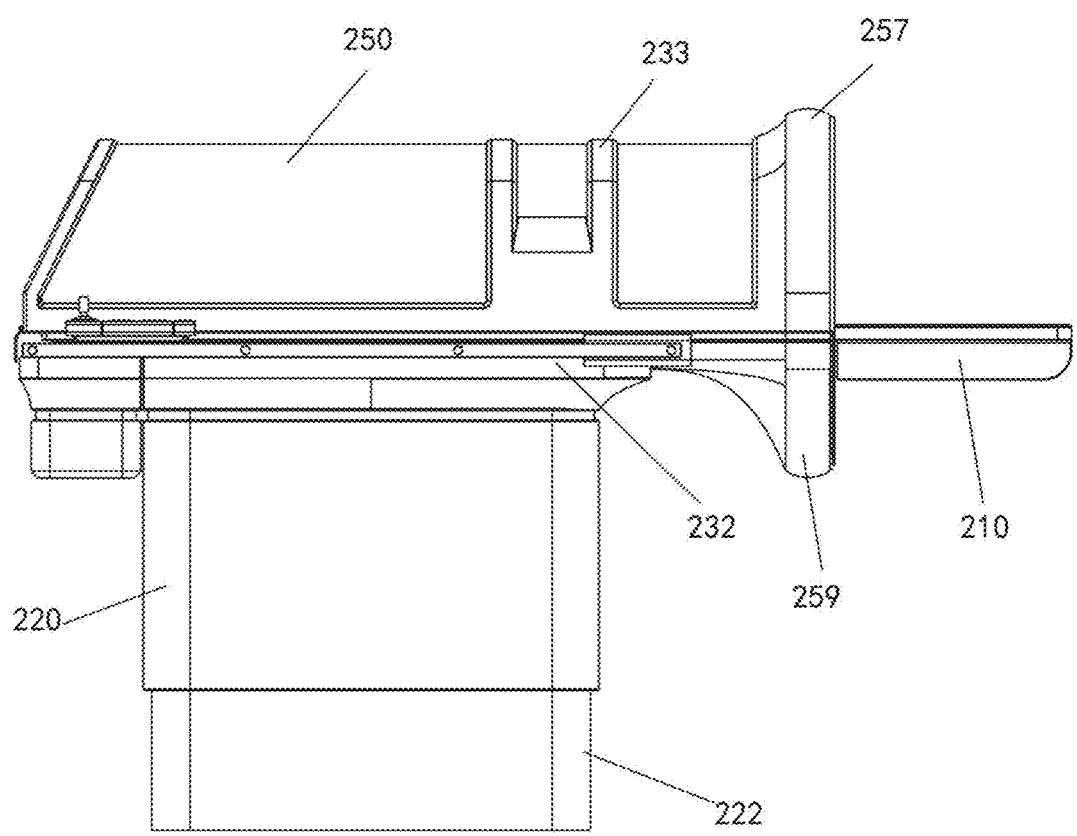
FIG. 5 is a side view of the patient table device of FIG. 4.
Figure 6:
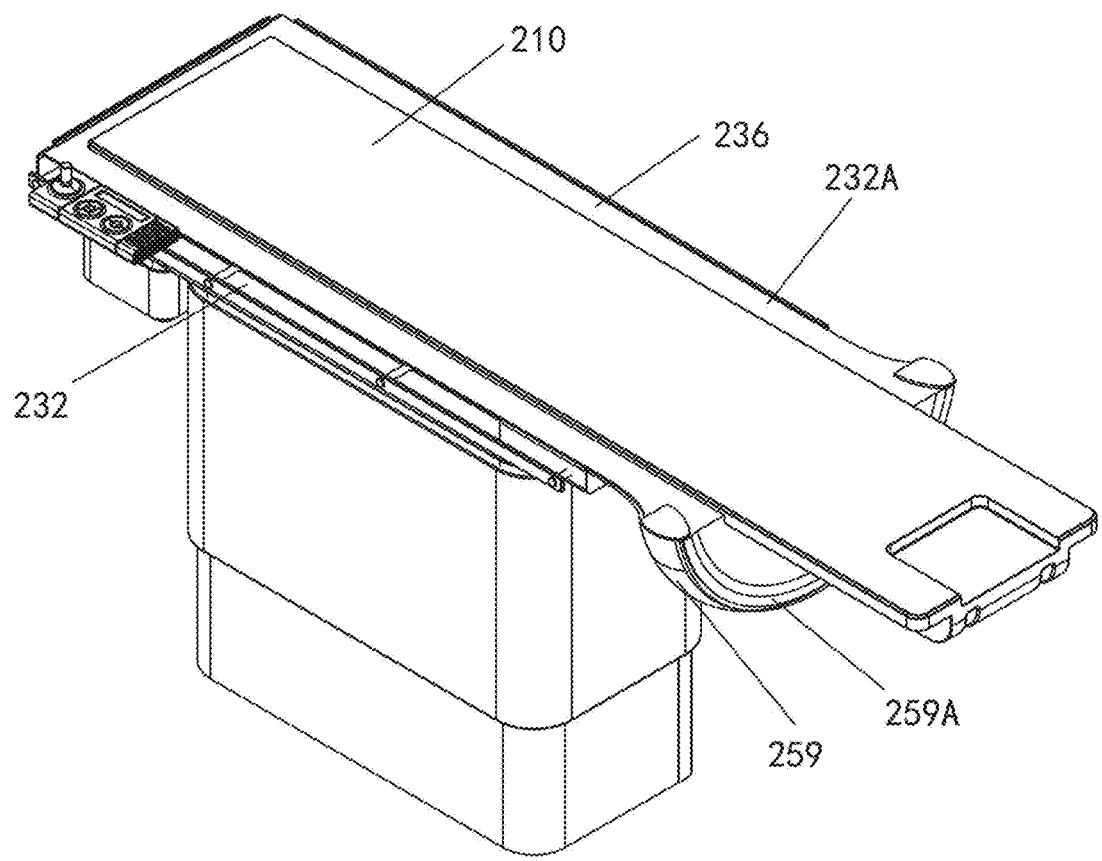
FIG. 6 is another perspective view of the patient table device of FIG. 4 in which an upper shielding component is removed.

Referring to FIGS. 4 through 6, the patient table device 200 comprises: a table portion 210 made from an insulative material and configured for the patient to lie on it in a posture suitable for being scanned by the MRI device 100; and a liftable frame 220 for supporting the table portion 210 and comprising a base 222. It will be appreciated that the base 222 may optionally be fitted with an additional displacement mechanism (not shown, e.g., wheels, etc.) such that the patient table device 200 is automatically or manually movable by the additional displacement mechanism.

The patient table device 200 further comprises a second shielding apparatus comprising a lower shielding component 230 and an upper shielding component 250 that is separable and removable from the lower shielding component 230. The upper shielding component 250 is configured to be placed or fitted above the lower shielding component 230 to form an arch-shaped delivery bore surrounding at least a portion of the table portion 210. The arch-shaped delivery bore has a second central axis H in the longitudinal direction which is derived when assuming the arch-shaped delivery bore is a corresponding complete cylindrical delivery bore. When the patient table device 200 is engaged with the MRI device 100, the delivery bore is aligned with the magnet bore and thus the second central axis H is aligned with the first central axis M, i.e., the second central axis H is in line with the first central axis M. The delivery bore has a first port for the patient's head to pass through and a second port for the patient's feet to pass through, both of which are positioned opposite to each other along the second central axis H. Thus, when the patient is scanned by the MRI system, a part of the patient's body is in the delivery bore and another part of the patient's body is in the magnet bore.

Referring again to FIG. 1, optionally, the upper shielding component 250 comprises an arch-shaped body comprising a first transparent layer 252, a second shielding layer 254, and a second transparent layer 256 arranged, i.e., laminated successively in a radially outward direction. The first transparent layer 252 and the second transparent layer 256 are made from an insulative material, e.g., glass or any other materials which are transparent or translucent. The second shielding layer 254 is similar or identical to the first shielding layer 132, i.e., it can be configured as a web or textile made from an electrically conductive material such that the patient lying on the table portion 210 can be visually observed through the arch-shaped body of the upper shielding component 250. Optionally, the electrically conductive material itself is transparent or translucent. The second shielding layer 254 comprises a third end 258 adjacent to the first port and a fourth end 260 adjacent to the second port, both of which are arch-shaped and positioned opposite each other along the second central axis H. The third end 258 protrudes or is exposed from the first transparent layer 252 and the second transparent layer 256 so as to be able to come into electrical contact with the second sleeve portion 140B of the anti-collision assembly after the MRI device 100 is aligned with the patient table device 200. The fourth end 260 may or may not protrude or be exposed from the first transparent layer 252 and the second transparent layer 256. Additionally, the second shielding layer 254 comprises two lateral sides that protrude or are exposed from the first transparent layer 252 and the second transparent layer 256 and extend along two longitudinal edges of the arch-shaped body.

Alternatively, if the arch-shaped body is designed with a diameter smaller than that of the second sleeve portion 140B due to necessity, the third end 258 cannot be matched with and in electrical contact with the second sleeve portion 140B, in which case the upper shielding component 250 can further comprise an upper electrically conductive section 257 made from a metallic material, the upper electrically conductive section 257 extending from the arch-shaped body along the second central axis H and expanding in diameter gradually so as to be able to be matched or aligned with the second sleeve portion 140B. E.g., the upper electrically conductive section 257 comprises an upper electrically conductive flange 257A adapted to be in electrical contact with a corresponding upper portion of the second sleeve portion 140B. The upper electrically conductive section 257 is electrically connected to the third end 258 of the second shielding layer 254 when mounted to the arch-shaped body and helps the upper shielding component 250 to come into electrical contact with the anti-collision assembly since the upper electrically conductive flange 257A has a radial thickness significantly greater than that of the second shielding layer 254.

Optionally, referring to FIGS. 4 and 5, a reinforcement 233 is provided on an external contour of the arch-shaped body to strengthen the arch-shaped body. The reinforcement 233 is made of a metallic material and can be integrally formed with the upper electrically conductive section 257 so as to enhance electromagnetic shielding effect of the upper shielding component 250.

Optionally, the lower shielding component 230 is secured to the liftable frame 220 and comprises a transfer plate 232. E.g., the table portion 210 is movably fitted above the transfer plate 232 via a common motorized conveyor which allows the table portion 210 to be moved longitudinally relative to the transfer plate 232 until the patient's body is positioned properly in the magnet bore. The motorized conveyor can be controlled by a manipulator 212.

E.g., the transfer plate 232 can be made from an insulative material including an engineering plastic which is magnetic field compatible, strong and light weighted. Alternatively or additionally, the transfer plate can be made from a magnetic resonance compatible material, e.g., a non-magnetic material, or a material that does not contain crystalline hydrate, etc.

For achieving magnetic shielding effect of the lower shielding component 230, at least a portion of the transfer plate 232 is plated with a suitable metallic material forming a plating that does not readily come off, coated with an electrically conductive coating layer, or clad with a sheet-like electrically conductive wrapping component, all of which are referred to hereinafter as a third shielding layer 235 (refer to FIG. 1). That is, the third shielding layer 235 is plated on, coated on, or wraps around a lower surface of the transfer plate 232 and side surfaces between the lower surface and a upper surface of the transfer plate 232. Due to skin effects, current flows only on electrically conductive surfaces (e.g., metal) of the lower shielding component 230 and does not affect magnetic field compatibility of the transfer plate 232.

Referring to FIG. 6, optionally, the upper surface of the transfer plate 232 has an upper edge 232A provided with an electrically conductive spacer 236. The electrically conductive spacer 236 is electrically connected to the third shielding layer 235 and has a width significantly greater than the radial thickness of the two lateral sides of the second shielding layer 254. When the upper shielding component 250 is placed above the lower shielding component 230, the two lateral sides of the second shielding layer 254 comes into electrical contact with the upper edge 232A of the upper surface of the transfer plate 232. Here, the electrically conductive spacer 236 helps the second shielding layer 254 to come into electrical contact with the third shielding layer 235. The electrically conductive spacer 236 is resilient to act as a cushion to avoid impact and damage when placing the upper shielding component 250 above the lower shielding component 230. The patient table device 200 with the upper shielding component 250 removed can be used as a common patient bed.

While the majority of the transfer plate 232 is substantially flat, the transfer plate 232 comprises a lower end section 259 extending along the second central axis H and being contoured to be able to be matched or aligned with a corresponding lower portion of the annular second sleeve portion 140B. The lower end section 259 is provided with a lower electrically conductive flange 259A for electrically contacting the corresponding lower portion of the second sleeve portion 140B. E.g., the lower electrically conductive flange 259A is electrically connected to the third shielding layer 235 and has a radial thickness greater than the thickness of the third shielding layer 235, which helps the lower shielding component 230 to come into electrical contact with the anti-collision assembly. When the upper shielding component 250 is placed above the lower shielding component 230, the second shielding layer 254 comes into electrical contact with the third shielding layer 235 to form a second section of the cutoff waveguide described above, and the second section of the cutoff waveguide contains the delivery bore. When the patient table device 200 is engaged with the MRI device 100, a flared transition section comprising the arch-shaped body or upper electrically conductive section 257 and the lower end section 259 along with the anti-collision assembly transitions the first section of the cutoff waveguide formed by the first shielding layer 132 to the second section of the cutoff waveguide formed by the second shielding layer 254 and the third shielding layer 235. Thus, the complete cutoff waveguide is formed by the first shielding apparatus along with the second shielding apparatus.

What is known is the following equation for the cutoff waveguide:

$$f_c = c/3.412r$$

where $f_c$ is a cutoff frequency, frequencies above $f_c$ can propagate freely through the cutoff waveguide, while frequencies below $f_c$ would be cut off by the cutoff waveguide; c is the speed of light 299792458 m/s; and r is the radius of the cutoff waveguide.

For effectively cutting off the frequencies below $f_c$, the length of the cutoff waveguide should be at least four times the diameter of the cutoff waveguide.

In one embodiment of the present application, the exemplary MRI system is an MRI system in which a magnetic field is present, e.g. in the order of at least 0.5 T, or even less than 0.35 T. The cutoff waveguide formed by the first shielding apparatus of the MRI device 100 along with the second shielding apparatus of the patient table device 200 of the exemplary MRI system has an effective length in the range of 2000 mm-2500 mm, preferably about 2300 mm. The first section of the cutoff waveguide formed by the first shielding apparatus has an effective length that is based on a distance from an isocenter (optimal imaging area) to the patient port of the magnet bore and is approximately half of the longitudinal length of the first shielding apparatus. The first shielding layer 132 of the exemplary MRI device 100 is cylindrical and has a diameter in the range of 500 mm-700 mm, preferably about 600 mm. The cutoff waveguide has an effective diameter that is about 60%-70% of the diameter of the first shielding layer 132 and, e.g., in the range of 300 mm-490 mm, preferably about 420 mm. Thus, in the embodiment of the present application, as the effective length of the cutoff waveguide is greater than four times the effective diameter of the cutoff waveguide, the cutoff waveguide can effectively cut off frequencies below about 400 MHz.

The cutoff waveguide formed by the first shielding apparatus and the second shielding apparatus of the exemplary MRI system can effectively cut off the natural electromagnetic signals from the external environment or the electromagnetic signals generated by the other precision instruments nearby which may interfere with the RF signals transmitted by the RF coil apparatus 160 of the MRI device 100. E.g., the RF coil apparatus 160 transmits the RF signals at a first frequency, while the cutoff waveguide is capable of cutting off RF signals at frequencies below a second frequency (as described above, about 400 MHz), the second frequency being significantly greater than the first frequency.

Thus, in some cases there is no need to provide a shielding cover, similar to the shielding door, to the second port of the delivery bore for RF shielding purpose, i.e., one end of the second shielding apparatus can be open, thereby providing a simplified way to structure and wiring while providing a non-enclosed environment to the patient being diagnosed by the MRI system such that the patient.

It should be noted that if the exemplary MRI system is an MRI system in which a strong magnetic field greater than 0.5 T, e.g., 1.0 T is present, the shielding cover can be provided to the second port of the delivery bore so as to ensure that the MRI device operates in an optimal condition. The shielding cover is adapted to close the second port, the shielding cover being in electrical contact with the second shielding layer and selectively being in electrical contact with the electrically conductive spacer when closing the second port. It will be appreciated that when the second port is closed, wires from outside of the patient table device 200 are connected into the lower shielding component 230 via an additional filter.

Optionally, when the liftable frame 220 is made of a metallic material, an insulative component 237 (referring to FIG. 1) can be interposed between the liftable frame 220 and the third shielding layer 235 so as to prevent the liftable frame 220 from affecting electromagnetic shielding effect of the second shielding apparatus.

Although some specific embodiments of the present application have been demonstrated in detail with examples, it should be understood by those skilled in the art that the above examples are only intended to be illustrative but not to limit the scope of the present application and the above embodiments could be modified without departing from the scope and spirit of the present application. The scope of the present application is defined by the appended claims.

The invention claimed is:

1. A magnetic resonance imaging system comprising:
   a magnetic resonance imaging device comprising:
      a cylindrical gradient coil apparatus,
      a radio frequency coil apparatus arranged coaxially inside and in proximity to an inner diameter surface of the gradient coil apparatus and configured to transmit radio frequency signals at a first frequency, and
      a first shielding apparatus comprising a first shielding layer arranged radially between the gradient coil apparatus and the radio frequency coil apparatus; and
   a patient table device engageable with the magnetic resonance imaging device and comprising:
      a table portion configured for a patient to lie on it, and
      a second shielding apparatus arranged around at least a portion of the table portion,
   wherein when the magnetic resonance imaging device is engaged with the patient table device, the first shielding apparatus is in electrical contact with the second shielding apparatus to form a cutoff waveguide around the table portion which is capable of cutting off radio frequency signals at frequencies below a second frequency, the second frequency being greater than the first frequency,
   wherein signals carried by electrical cables and/or data transmission cables connected into the gradient coil apparatus from outside of the magnetic resonance imaging device are not filtered, and
   wherein the first shielding layer comprises an end protruding from the gradient coil apparatus and the radio frequency coil apparatus, a filer being arranged on the end, the filer being electrically connected to the first shielding layer, and electrical cables and/or data transmission cables being connected into the radio frequency coil apparatus from outside of the first shielding layer via the filer.

2. The magnetic resonance imaging system according to claim 1, wherein the magnetic resonance imaging device is movable, and wherein the first shielding apparatus further comprises an anti-collision assembly electrically connected to the first shielding layer and configured to stop the movement of the magnetic resonance imaging device and simultaneously to come into in electrical contact with the second shielding apparatus when the magnetic resonance imaging device is moved to be engaged with the patient table device.

3. The magnetic resonance imaging system according to claim 2, wherein the anti-collision assembly comprises a resilient anti-collision collar and an electrically conductive sleeve, the electrically conductive sleeve comprising a first sleeve portion and a second sleeve portion that cover both ends of the anti-collision collar respectively and are not in electrical contact with each other when the magnetic resonance imaging device is disengaged from the patient table device, and the anti-anti-collision collar is compressed to bring the first sleeve portion into electrical contact with the second sleeve portion when the magnetic resonance imaging device is engaged with the patient table device.

4. The magnetic resonance imaging system according to claim 1, wherein the magnetic resonance imaging device defines a columnar magnet bore having a center and comprising a service port distal from the patient table device when the magnetic resonance imaging device is engaged with the patient table device, and wherein the first shielding apparatus further comprises a shielding door adapted to close the service port and to be openable, the shielding door being in electrical contact with the first shielding layer when closing the service port.

5. The magnetic resonance imaging system according to claim 1, wherein the second shielding apparatus defines a delivery bore around the at least a portion of the table portion, the delivery bore comprising an open port configured for the patient's feet to pass through.

6. The magnetic resonance imaging system according to claim 1, wherein the second shielding apparatus comprises a lower shielding component and an upper shielding component separable from the lower shielding component, the upper shielding component being in electrical contact with the lower shielding component when placed above the lower shielding component.

7. The magnetic resonance imaging system according to claim 6, wherein the upper shielding component comprises an arch-shaped body comprising a first transparent layer, a second shielding layer and a third transparent layer which are laminated with each other, the first transparent layer and the third transparent layer being insulative and the second shielding layer being electrically conductive and being configured as a web made from an electrically conductive material such that that the arch-shaped body is transparent or translucent.

8. The magnetic resonance imaging system according to claim 7, wherein the upper shielding component further comprises an upper electrically conductive section extending longitudinally from the arch-shaped body and expanding in diameter gradually so as to be able to be aligned with the first shielding apparatus and comprising an upper electrically conductive flange adapted to be in electrical contact with the first shielding apparatus.

9. The magnetic resonance imaging system according to claim 6, wherein the lower shielding component comprises a transfer plate above which the table portion is movably fitted and which has an upper surface with an edge provided with a resilient electrically conductive spacer, the upper shielding component being in electrical contact with the lower shielding component via the electrically conductive spacer when the upper shielding component is placed above the lower shielding component.

10. The magnetic resonance imaging system according to claim 9, wherein the transfer plate comprises a lower end section extending longitudinally and being contoured to be able to be aligned with the first shielding apparatus, the lower end section being provided with a lower electrically conductive flange adapted to be in electrical contact with the first shielding apparatus.

\* \* \* \* \*